United States Patent [19]
Hayashi

[11] Patent Number: 5,360,760
[45] Date of Patent: Nov. 1, 1994

[54] VAPOR PHASE EPITAXIAL GROWTH METHOD OF A COMPOUND SEMICONDUCTOR

[75] Inventor: Jun Hayashi, Tokyo, Japan

[73] Assignee: NEC Corporation, Japan

[21] Appl. No.: 39,749

[22] Filed: Mar. 30, 1993

[30] Foreign Application Priority Data

Apr. 2, 1992 [JP] Japan .................................. 4-080169
Aug. 27, 1992 [JP] Japan .................................. 4-228182

[51] Int. Cl.$^5$ ............................................. H01L 21/20
[52] U.S. Cl. ..................................... 117/93; 117/89; 117/953
[58] Field of Search ............... 437/108, 107, 109, 112, 437/133; 156/610, 613, 614

[56] References Cited
FOREIGN PATENT DOCUMENTS

| 148279 | 5/1981 | Germany | 437/108 |
| 60-60715 | 4/1985 | Japan | 437/108 |
| 63-69220 | 3/1988 | Japan | 437/108 |
| 2203519 | 8/1990 | Japan | 437/108 |

OTHER PUBLICATIONS

"High–Speed Planar–Structure InP/InGaAsP/InGaAs Avalanche Photodiode Grown by VPE", Y. Sugimoto, *Electronics Letters*, 2nd Aug. 1984, vol. 20, No. 16, pp. 653–654.

Primary Examiner—R. Bruce Breneman
Assistant Examiner—Ramamohan R. Paladugu
Attorney, Agent, or Firm—Laff, Whitesel, Conte & Saret

[57] ABSTRACT

A vapor phase epitaxial growth method of a compound semiconductor is provided. On a semiconductor substrate held by a holder, a first epitaxial layer is grown using a first growth gas and then, a separator gas is emitted to the vicinity of the substrate to separate the substrate from the first growth gas. After the separator gas is removed from the vicinity, a second growth gas is supplied to the vicinity to form a second epitaxial layer on the first epitaxial layer. Since the substrate is separated by the separator gas from the first growth gas, transition regions of crystal composition and carrier concentration are difficult to be generated.

9 Claims, 6 Drawing Sheets

VAPOR PHASE EPITAXIAL GROWTH METHOD OF A COMPOUND SEMICONDUCTOR

BACKGROUND OF THE INVENTION

1. Field of the Invention

The present invention relates to a vapor phase epitaxial growth method of a compound semiconductor such as GaAs, InP and InGaAs and a system used therefor.

2. Description of the Prior Art

Recently, a demand for photoreceivers made of III-V compound semiconductors such as avalanche photodiodes (APDs) and PIN photodiodes (PIN-PDs) in long-wavelength optical communication systems has increased rapidly.

The APDs and PIN-PDs are generally formed in heteroepitaxial layers which are formed on a n+-InP substrate. The layers are generally obtained by a vapor phase epitaxy (VPE) using hydrides or metal organic compounds (See Y. SUGIMOTO ET AL., "ELECTRONICS LETTERS", Vol 20, No. 16, PP 653–654, Aug. 2, 1984).

FIG. 1 shows an example of a conventional crystal growth system used for hydride VPE of a III-V compound semiconductor.

In FIG. 1, there is provided with a reactor 52 in a crystal growing furnace 51. In the reactor 52, an upper reaction chamber 59 and a lower reaction chamber 60 are formed, and a substrate holder 57 for holding a semiconductor substrate 58 is provided in the downstream side (the right side in FIG. 1) in the reactor 52. The holder 58 can be rotated around a horizontal shaft (not shown) and set at a position in the upper reaction chamber 59, which is shown by solid lines in FIG. 1, and another position in the lower reaction chamber 60, which is shown by broken lines in FIG. 1, alternately. The holder 57 is located in the low-temperature area (approximately 700° C.) in the reactor 52.

In the reaction chambers 59 and 60, there are gas diffusers 56a and 56b for diffusing gases supplied in the chambers 59 and 60, respectively. The respective diffusers 56a and 56b are composed of several plates having many holes.

Materials 55a and 55b stored in containers for the group III component of the III-V semiconductor are disposed in the upstream side of the chamber 59 and materials 55c and 55d stored in containers for the group III component thereof are disposed in the upstream side of the chamber 60. The materials 55a, 55b, 55c and 55d are located in the high-temperature area (approximately 850° C.) in the reactor 52.

A carrier gas for the materials 55a and 55b is supplied to the chamber 59 through tubes 53a and 53b which are connected to the upstream end of the chamber 59, and a carrier gas for the materials 55c and 55d is supplied to the chamber 60 through tubes 53c and 53d which are connected to the upstream end of the chamber 60.

Gaseous materials for the group V component of the III-V semiconductor (and a gaseous n- or p- dopant, when required) is supplied through tubes 54a and 54b to the chamber 59 and 60, respectively. Ends of the tube 54a and 54b are located near the downstream ends of the chambers 59 and 60 respectively so that the gaseous materials may not chemically react to the materials 55a, 55b, 55c and 55d.

The VPE of the III-V compound semiconductor using the above-identified system is performed as follows:

First, the carrier gas (e.g., HCl) for the materials 55a and 55b (e.g., Ga or In) is introduced through the tube 53a and 53b into the high-temperature area of the chamber 59 heated in the furnace 51. The carrier gas chemically react to the materials 55a and 55b to generate a gas (e.g., GaCl or InCl), which is used for the group III component material. On the other hand, a gaseous hydride (e.g., $AsH_3$ or $PH_3$) of the group V component is introduced through the tube 54a into the high-temperature area of the chamber 59.

The gaseous group III component material and the gaseous hydride of the group V component in the high-temperature area of the chamber 59 are mixed with each other near the end of the tube 54a and diffused by the diffuser 56 to flow into the low-temperature area thereof, in which the substrate holder 57 is provided. The gaseous group III and V materials in the low-temperature area chemically react to each other and thereby a first III-V semiconductor epitaxial layer having a predetermined composition grows on the substrate 58.

Next, after the substrate holder 57 is rotated in the reactor 52 and set at the position in the lower reaction chamber 60, a carrier gas for the group III component is introduced through the tube 53c and 53d into the chamber 60 and at the same time, a gaseous hydride (e.g., $PH_3$) of the group V component is introduced through the tube 54b into the chamber 60. Then, a second III-V semiconductor epitaxial layer having a predetermined composition grows on the first epitaxial layer.

Concretely, in case that InGaAs/InP heteroepitaxial layers are formed on an n+-InP substrate 58, metallic gallium (Ga) and metallic indium (In) are used for group III component materials, and hydrogen chloride (HCl) is used for a carrier gas for the group III component materials and arsine ($AsH_3$) is used for a group V component material in the upper reaction chamber 59. Besides, metallic Indium (In) is used for a group III component material and phosphine ($PH_3$) is used for a group V component material in the lower reaction chamber 60.

First, the substrate holder 57 is set at the position in the lower reaction chamber 60 and then an indium phosphide (InP) layer grows on the substrate 58. Next, the holder 57 is moved and set at the position in the upper reaction chamber 59, and then an indium gallium arsenide (InGaAs) layer grows on the InP layer. Thus, InGaAs/InP heteroepitaxial layers are formed on the n+-InP substrate 58.

If an n-dopant gas such as silicon (Si) or sulfur (S) is introduced into the chamber 59 or 60 during the epitaxial growth, an n-epitaxial layer grows.

With the above-identified VPE, supply of HCl as the carrier gas and the $PH_3$ as the group V component material are stopped when the growth of the InP layer in the chamber 60 has finished, and at the same time, the holder 57 is moved and set at the position in the chamber 59. The gaseous HCl and $PH_3$ remain in the chamber 60 when the supply thereof is stopped, and the rotation speed of the holder 57 is set as low as approximately 10 rpm with regard to falling of the substrate 58. Therefore, the InP layer epitaxially grows slightly in a short time from the stopping of the supply of the HCl and $PH_3$ in the chamber 60 to start of the growth of the InGaAs layer in the chamber 59. In addition, the In- GaAs and InP layers grow in the HCl and PH₃ which are not in stationary states.

Accordingly, a transition region of crystal (semiconductor) composition in which the composition is not constant is generated at a boundary between the InP and InGaAs layers and as a result, there arises a problem that heteroepitaxial layers having a layer structure as designed cannot be obtained. The transition region adversely affects device characteristics.

In addition, in case that the heteroepitaxial layers contain an n- or p-layer with impurity doped, a transition region of carrier (dopant) concentration in which the concentration thereof changes loosely is generated at the boundary between the InP and InGaAs layers due to a remaining dopant gas. As a result, there arises a problem that a carrier (dopant) profile in which the carrier concentration changes sharply at the boundary of adjacent layers cannot be obtained.

FIG. 2 shows an example of InGaAs/InP heteroepitaxial layers on a n+-InP substrate obtained by the above-identified VPE. In the layers, it was found that widths of transition regions of crystal composition at boundaries between an i-InGaAs layer (thickness: 1 $\mu$m) and adjacent n-InP layers (thickness: 1 $\mu$m, carrier concentration: $2 \times 10^{16}$ cm$^{-3}$) are approximately 20 nm by the transmission electron microscopy (TEM), and that widths of transition regions of carrier concentration at the boundaries are approximately 30 nm by the secondary ion mass spectroscopy (SIMS).

SUMMARY OF THE INVENTION

Therefore, an object of the present invention is to provide a vapor phase epitaxial growth method of a compound semiconductor and a system used therefor, by which heteroepitaxial layers having a narrower width of transition region of crystal composition at a boundary between adjacent layers thereof can be obtained.

Another object of the present invention is to provide a vapor phase epitaxial growth method of a compound semiconductor and a system used therefor, by which heteroepitaxial layers having a carrier profile wherein carrier concentration changes more sharply at a boundary between adjacent layers thereof can be obtained.

In a first aspect of the present invention, a vapor phase epitaxial growth method of a compound semiconductor is provided. The method comprises a first step of epitaxially growing a first compound semiconductor layer on a semiconductor substrate held by a substrate holder in a reactor using a first growth gas, a second step of supplying a separator gas to the vicinity of the substrate thereby to separate the substrate from the first growth gas, a third step of removing the separator gas from the vicinity of the substrate, and a fourth step of supplying a second growth gas to the vicinity of the substrate thereby to epitaxially grow a second compound semiconductor layer on the first compound semiconductor layer.

The steps may be performed whenever at least one kind and mass of the first and second growth gasses flows.

The first and second growth gasses mean gasses used for epitaxial growth including a carrier gas. In case of an n- or p-epitaxial layer being grown, at least one of the first and second growth gasses contains an n- or p- dopant.

Preferably, a gaseous group III component material and a gaseous group V component material are used as the first and second growth gasses thereby to epitaxially grow III-V compound semiconductor layers, and a gas containing a group V component material is used as the separator gas. There is an advantage that the dissociation of the group V material from the first compound semiconductor layer is avoided even if its high vapor pressure.

In addition, preferably, to supply and remove the separator gas, there is a pipe member having a first opening and a first path for emitting the separation gas and a second opening and a second path for sucking the separator gas in the vicinity of the substrate. In this case, preferably, the substrate is recessed behind the pipe member so that the separator gas may arrive at the substrate when the separator gas being emitted, and the substrate is projected beyond the pipe member so that the substrate may not affected by the separator gas emitted when the separator gas being sucked.

With the method of the present invention, the substrate is separated by the separator gas from the first growth gas after the growth using the first growth gas, and then the separator gas is removed from the vicinity of the substrate for growth using the second growth gas. Thus, the transition region of crystal composition is extremely difficult to be generated at a boundary between the first and second compound epitaxial layers.

In addition, the sharpness of the carrier concentration in the transition region of crystal composition is extremely difficult to be reduced.

Accordingly, compound semiconductor heteroepitaxial layers having a narrower width of the transition region and a carrier profile in which carrier concentration changes more sharply can be obtained.

There is no danger that the growth of the second compound semiconductor layer is affected by the separator gas because the separator gas in the vicinity of the substrate is removed in advance.

In a second aspect of the present invention, a system for a vapor phase epitaxial growth of a compound semiconductor is provided. The system comprises a reactor, means for heating the reactor, a substrate holder provided in the reactor for holding a semiconductor substrate, means for supplying a first and a second growth gases into the reactor to epitaxially grow a first and second compound semiconductor layers on the substrate, means for supplying a separator gas to the vicinity of the substrate to separate the substrate from the first or second growth gas, and means for removing the separator gas from the vicinity of the substrate prior to growth of the first or second compound semiconductor layers.

In the system of the present invention, the means for supplying and removing a separator gas may be provided separately from or monolithically with the holder.

In case that both of the means for supplying and removing a separator gas are provided separately from the holder, they are preferably provided in a pipe member having a first opening and a first path for emitting the separation gas to the vicinity of the substrate, and a second opening and a second path for sucking the separation gas from the vicinity of the substrate. There is an advantage because the system of the present invention can be easily realized by adding the pipe member to a conventional system.

In this case, preferably, the pipe member and the holder can be relatively moved.

Further preferably, the substrate is recessed behind the pipe member so that the separator gas that is emitted may be easy to arrive at the substrate when the separator gas being emitted, and the substrate is in front of the pipe member so that the substrate may not be affected in growth by the separator gas emitted when the separator gas being sucked.

The first opening of the pipe member is preferably located at the upstream side compared with the second opening thereof.

In case both of the separator gas supplying and removing means are provided monolithically with the holder, there is an advantage in that the system of the present invention can be realized with a simple structure.

The holder may be designed so as to hold a plurality of the substrates at the same time.

With the system of the present invention, the method of the present invention can be performed easily.

DESCRIPTION OF THE PREFERRED EMBODIMENTS

Preferred embodiments of the present invention will be described below while referring to FIGS. 3 to 6.

First Embodiment

Figure 3:
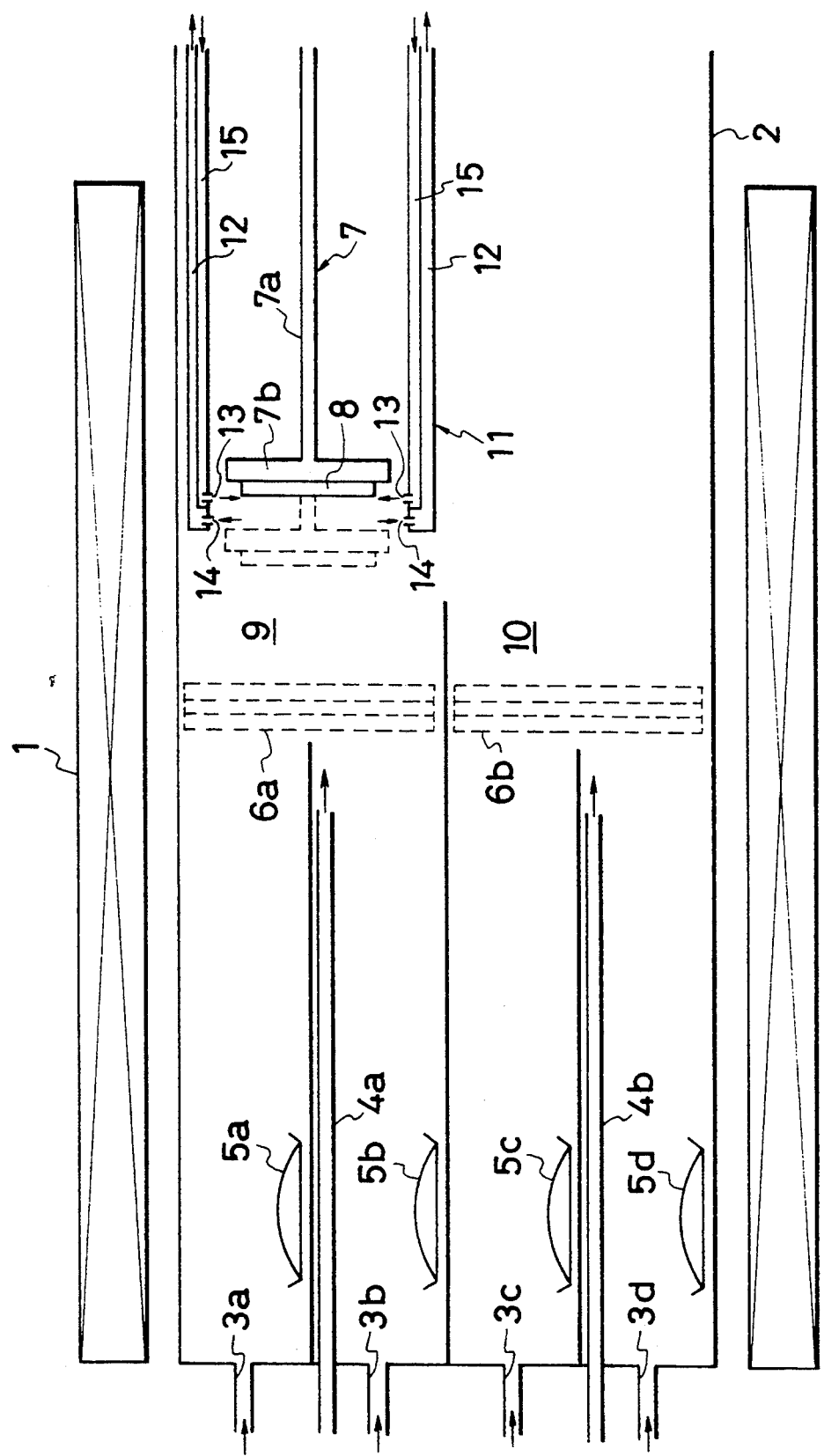
FIG. 3 is a cross-sectional view schematically showing a main part of a vapor phase epitaxial growth system of a III-V compound semiconductor according to a first embodiment of the present invention.

In a vapor phase epitaxial growth system of a III-V compound semiconductor according to a first embodiment, as shown in FIG. 3, there is provided with a reactor 2 in a crystal growing furnace 1. In the reactor 2, an upper reaction chamber 9 and a lower reaction chamber 10 are formed, and a substrate holder 7 is provided at the downstream side (the right side in FIG. 3) in the reactor 2.

The holder 7 is composed of a support shaft 7a and a plate-like body 7b fixed with the end of the shaft 7a, and an n-InP substrate 8 is held on the upstream side surface of the body 7b. The holder 7 is located in the low-temperature area (approximately 700° C.) of the reactor 2. The holder 7 can be rotated around a horizontal shaft (not shown) and set at a position in the upper reaction chamber 9 (see FIG. 3), and at another position in the lower reaction chamber 60 (not shown), alternately. The holder 8 can be shifted in a direction parallel to the shaft 7a, or a horizontal direction in FIG. 3.

There is a cylindrical pipe member 11 so as to surround the holder 7. The member 11 has first openings 13 for emitting a separator gas and second openings 14 for sucking the separator gas at the upstream end of the member 11. The first and second openings 13 and 14 are circularly arranged on the inner surface of the upstream end of the member 11 at intervals. The entire holder 7 may be housed by the member 11, as shown in FIG. 3. The first openings 13 are communicated with a gas source (not shown) disposed outside of the reactor 2 through a first path 15 formed in the member 11. The gas source supplies a gas containing a gaseous group V component material used for the separator gas.

If the gas source is operated, the separator gas is emitted through the path 15 from the first openings 13 toward the center of the member 11 to be supplied to the vicinity of the substrate 8.

The second openings 14 are arranged at positions nearer to the upstream end of the member 11 than the first openings 13, and are communicated with a gas suction device (not shown) disposed outside of the reactor 2 through a second path 12 formed in the member 11.

If the gas suction device is operated, the separator gas in the vicinity of the substrate 8 is sucked into the path 12 through the second openings 14 in order to be drawn off.

When the separator gas containing the gaseous group V component material is supplied to the vicinity of the substrate 8 through the first openings 13, the substrate holder 7 is set at the inside position shown by solid lines in FIG. 3 so that the position of the substrate surface matches the position of the first openings 13. Thus, the separator gas emitted can be effectively utilized.

When the III-V compound semiconductor layer grows epitaxially, the holder 7 is set at the outside position shown by broken lines in FIG. 3 so that the entire substrate 8 held is located in the outside of the member 11. Thus, epitaxial growth is difficult to be affected by the separator gas.

The first and second openings 13 and 14 may be circular holes or slits.

The first openings 13 are arranged so that the separator gas is emitted to the growth surface of the substrate 8 uniformly, and the second openings 14 are arranged so that the separator gas in the vicinity of the substrate 8 is sucked and drawn off uniformly.

In the embodiment, the holder 7 is shifted parallel to the shaft 7a of the holder 7 and the pipe member 11 is not shifted, however, in contrast with this, the member 11 may be shifted and the holder 7 may be shifted.

In the reaction chambers 9 and 10, there are gas diffusers 6a and 6b for diffusing gases supplied therein, respectively. The respective diffusers 6a and 6b are composed of several plates having many holes and arranged at the downstream side compared with the diffusers 6a and 6b.

Group III component materials 5a and 5b are put in containers disposed near to the upstream end in the chamber 9, and group III component materials 5c and 5d are put in containers disposed near to the upstream end in the chamber 10. The materials 5a, 5b, 5c and 5d are located in the high-temperature area (approximately 850° C.) in the reactor 2.

Carrier gasses for the group III component materials 5a and 5b are supplied to the chamber 9 through tubes 3a and 3b which are connected to the upstream end of the chamber 9, and carrier gases for the group III component materials 5c and 5d are supplied to the chamber 10 through tubes 3c and 3d which are connected to the upstream end of the chamber 10.

Gaseous group V component materials and a gaseous dopant are supplied through tubes 4a and 4b to the chamber 9 and 10, respectively. The ends of the tube 4a and 4b are located near to the downstream ends of the chambers 9 and 10, respectively so that the group V component materials may not chemically react to the group III component materials 5a, 5b, 5c and 5d.

A vapor phase epitaxial growth method of heteroepitaxial layers of a III-V compound semiconductor using the above-identified system will be described below.

First, 400 g of gallium (Ga) as the group III component material 5a and 800 g of indium (In) as the group III component material 5b are disposed in the upper reaction chamber 9, 800 g of Ga as the group III component materials 5c and 5d are disposed in the lower reaction chamber 10. The pipe member 11 is set at the position in the chamber 10 and the substrate holder 7 is set at the outside position with the body 7b thereof being projected from the member 11. The $n^+$-InP substrate 8 is held on the surface of the body 7a. And then, the reactor 2 is inserted in the furnace 1 to be heated.

Next, the pipe member 11 together with the holder 7 is rotated around the horizontal shaft to be set at the position in the upper reaction chamber 9. The holder 7 is shifted toward the downstream side to be set at the inside position. Thus, the substrate 8 is disposed at the position nearest to the first openings 13 thereby to receive the separator gas emitted from the openings 13 effectively.

Gaseous $PH_3$ of hydride of the group V component phosphorus (P) and $H_2$ as the carrier gas thereof are emitted from the first openings 13 in the pipe member 11 at rates of 200 ml/min and 1000 ml/min, respectively, to the vicinity of the substrate 8 recessed behind the member 11. During the emission, through the tubes 3c and 3d, gaseous 10% HCl as the carrier gases for the group III component materials is supplied into the lower reaction chamber 10 at a rate of 100 ml/min. At the same time, through the tube 4, gaseous 10% phosphine ($PH_3$) as the hydride of the group V component material and gaseous 0.1% silane ($SiH_4$) as the n-dopant is supplied into the lower reaction chamber 10 at rates of 150 ml/min and 5 ml/min, respectively. The gaseous HCl, $PH_3$ and $SiH_4$ are transmitted to the vicinity of the holder 7 after being diffused by the diffuser 6b.

After supply of the gaseous HCl, $PH_3$ and $SiH_4$ becomes stationary, the pipe member 11 together with the holder 7 is rotated and set the position in the lower reaction chamber 10, and the holder 7 is shifted upstream. Thus, the substrate 8 is set outside of the member 11.

The holder 7 is set at a position, for example, in which the growth surface of the substrate 8 is positioned upstream from the second openings 14 by 3 mm. The gaseous $PH_3$ and $H_2$ emitted from the first openings 13 are sucked through the second openings 14 and drawn off simultaneously with the shift of the holder 7.

Then, an n-InP layer grows epitaxially on the substrate 8 disposed in the low-temperature region (approximately 700° C.) of the reactor 2. Since the substrate 8 is in front of the pipe member 11 and the gaseous $PH_3$ and $H_2$ as the separator gas in the vicinity of the substrate 8 is sucked and drawn off immediately after the shift of the holder 7, there is no danger that the separator gas affects the epitaxial growth.

When a n-InP epitaxial layer having a desired thickness and a carrier concentration is obtained, gas supply to the lower reaction chamber 10 is stopped, and the pipe member 11 together with the holder 7 is rotated and set at the position in the upper reaction chamber 9. And at the same time, the holder 7 is shifted downstream and the substrate is set inside the member 11, and suction of the separator gas is stopped.

Then, the gaseous $PH_3$ and $H_2$ as the separator gas is emitted again from the first openings 13.

Through the above-described processes, the surface of the substrate 8 is covered with the separator gas thereby to separate from the gaseous group III and V component materials. Accordingly, the transition region of crystal composition due to remaining growth gases in the chamber 2 is avoided to be generated.

When the substrate 8 is set in the upper reaction region 9, through the tubes 3a and 3b, gaseous 10% HCl as the carrier gas for the III component material is supplied to the chamber 9 at a rate of 100 ml/min. And at the same time, through the tube 4a, gaseous 10% arsine ($AsH_3$) as the V component material is supplied to the chamber 9 at a rate of 50 ml/min.

About two minutes later and when the supply of the HCl and $AsH_3$ becomes stationary, the holder 7 is shifted upstream and set at the outside position, and at the same time, the gaseous $PH_3$ and $H_2$ as the separator gas is sucked from the second openings 14 and draw off.

Then, an i-InGaAs layer having narrower transition regions of crystal composition and carrier concentration grows epitaxially on the n-InP layer grown in the upper reaction chamber 10 using the III and V component materials.

If the above-described processes are repeated, heteroepitaxial layers having such narrower transition regions as above and a desired structure of III-V compound semiconductors can be obtained.

Figure 1:
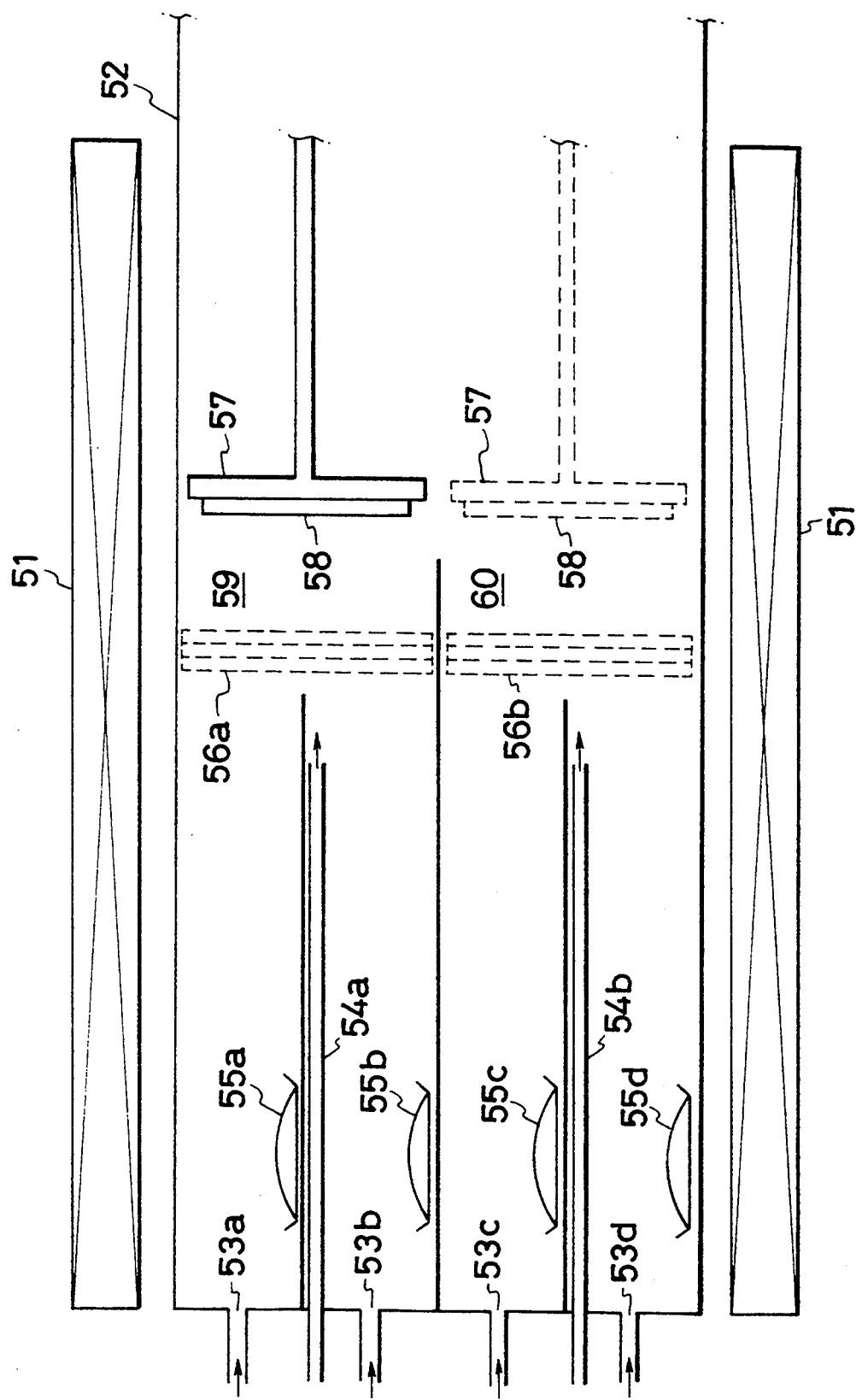
FIG. 1 is a cross-sectional view schematically showing a main part of a conventional vapor phase epitaxial growth system of a III-V compound semiconductor.
Figure 2:
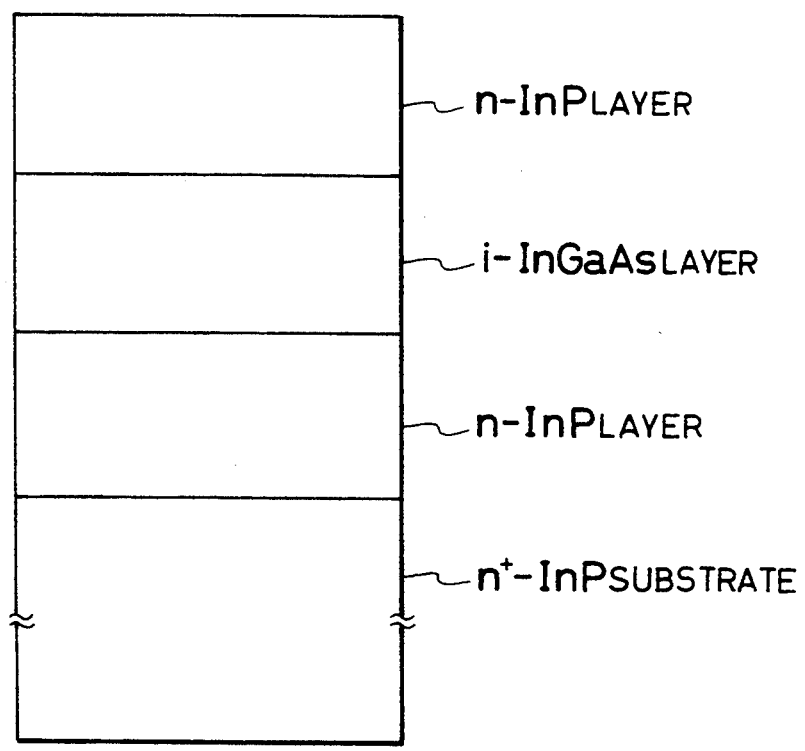
FIG. 2 is a cross-sectional view schematically showing a heteroepitaxial layers of a III-V compound semiconductor.

Heteroepitaxial layers having the same structure as in FIG. 2 were grown by the above-described processes. In the layers, it was found that widths of transition regions of crystal composition at boundaries between the i-InGaAs layer and the adjacent n-InP layers are approximately 4 nm, which is nearly equal to ($\frac{1}{2}$) of the conventional one, by the transmission electron microscopy (TEM), and that widths of transition regions of carrier concentration at the boundaries are approximately 7 nm, which is nearly equal to ($\frac{1}{4}$) of the conventional one, by the secondary ion mass spectroscopy (SIMS).

Second Embodiment

Figure 4:
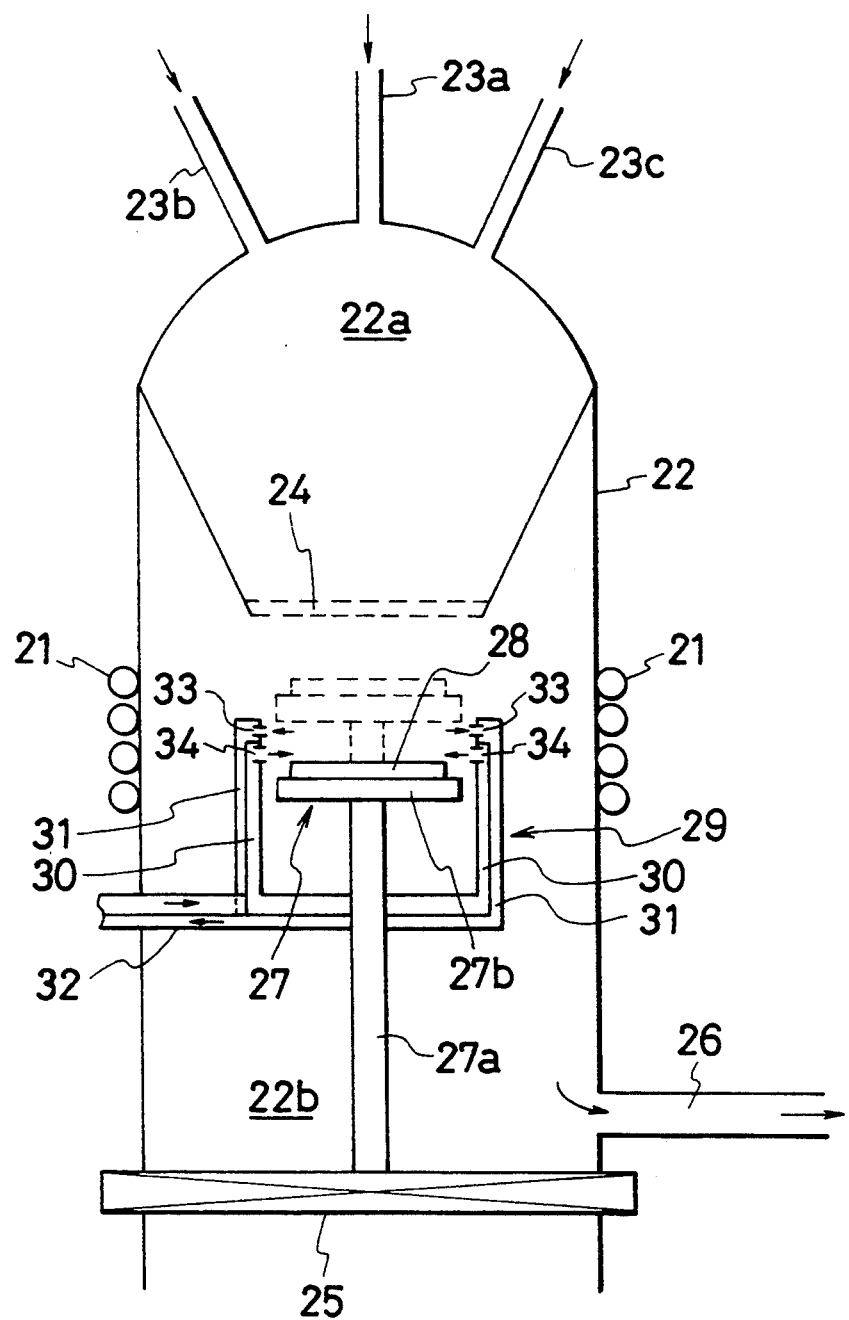
FIG. 4 is a cross-sectional view schematically showing a main part of a vapor phase epitaxial growth system of a III-V compound semiconductor according to a second embodiment of the present invention.

FIG. 4 shows a vapor phase epitaxial growth system of a III-V compound semiconductor according to a second embodiment, which is used for a metal organic vapor phase epitaxy (MOVPE).

In the system, as shown in FIG. 4, there is a reactor 22 having tubes 23a, 23b and 23c for introducing gaseous III and V component materials of the semiconductor at the head, and having a gate valve 25 at the bottom. An RF coil 21 for heating is wounded around the reactor 22 in the outside thereof. The inside of the reactor 22 is divided into a gas introducing chamber 22a and a reaction chamber 22b.

In the reaction chamber 22b, there is a substrate holder 27 for holding a semiconductor substrate 28. The holder 7 is made of a carbon block and the surface thereof is coated by a SiC film, and is composed of a support shaft 27a and a plate-like body 27b fixed with the end of the shaft 27. The holder 7 can be moved upward and downward to be set an upper position shown by broken lines in FIG. 4 and a lower position shown by solid lines in FIG. 4, alternately. The substrate 28 is held on the top surface of the body 27b.

There is a cylindrical pipe member 29 so as to surround the holder 27. The entire body 27b of the holder 27 may be housed by the member 11, as shown in FIG. 4. The member 29 has first openings 34 for emitting a separator gas and second openings 33 for sucking the separator gas at the upstream (upper) end of the member 29.

The first and second openings 34 and 33 are circularly arranged on the inner surface of the upstream end of the member 29 at intervals. The first openings 34 are communicated with a gas source (not shown) disposed outside of the reactor 22 through a first path 30 formed in the member 29. The gas source supplies a gas containing a gaseous group V component material used for the separator gas.

If the gas source is operated, the separator gas is emitted through the path 30 from the first openings 34 toward the center of the member 29 to be supplied to the vicinity of the substrate 28.

The second openings 33 are arranged at positions nearer to the upstream end of the member 29 than the first openings 34, and are communicated with a gas suction unit (not shown) disposed outside of the reactor 22 through a second path 31 formed in the member 29.

If the gas suction unit is operated, the separator gas in the vicinity of the substrate 28 is sucked into the second path 31 through the second openings 33 to be drawn off.

Similar to the system of the first embodiment, when the separator gas is supplied to the vicinity of the substrate 28 through the first openings 34, the substrate holder 27 is set at the inside position so that the position of the substrate surface matches the position of the emitted first openings 34. Thus, the separator gas can be effectively utilized.

When the III-V compound semiconductor layer grows epitaxially, the holder 27 is set at the outside position so that the entire substrate 28 held is located in the outside of the member 29. Thus, epitaxial growth is difficult to be affected by the separator gas.

The first openings 34 are arranged so that the separator gas is emitted uniformly over the growth surface of the substrate 28, and the second openings 33 are arranged so that the separator gas in the vicinity of the substrate 28 is sucked and drawn off uniformly.

An MOVPE of heteroepitaxial layers of a III-V compound semiconductor using the above-identified system will be described below.

First, the holder 27 is moved downward through the gate valve 25 opened and is set the lower (inside) position shown by solid lines in FIG. 42.

Next, the gate valve 25 is closed and gaseous $H_2$ for a carrier gas is supplied to the chamber 22 through a tube 23a at a rate of 5 ml/min and flows out through a tube 26. When the pressure in the chamber 22 reaches 70 Torr, gaseous $PH_3$ of hydride of the group V component P and $H_2$ as the carrier gas thereof are emitted from the first openings 32 in the pipe member 29 at rates of 200 ml/min and 1000 ml/min, respectively, to the vicinity of the substrate 28 behind in the member 29.

An electric current is supplied to the RF coil 21 to heat the substrate 28. When the temperature of the substrate 28 reaches 650° C., through the tube 23b, gaseous trimethylindium (TMIn) $(CH_3)_3In$ as a metal organic compound of the group III component In is supplied to the chamber 22 at a rate of 400 ml/min. And at the same time, through the tube 23c, gaseous $PH_3$ of hydride of the group V component P and gaseous 0.1% disillane $(Si_2H_6)$ as the n-dopant are supplied to the chamber 22 at rates of 100 ml/min and 2 ml/min, respectively.

After the gaseous TMIn, $PH_3$ and $(Si_2H_6)$ in the chamber 22 become stationary, the holder 27 is moved upward and set at the upper (outside) position shown by broken lines in FIG. 4, in which the growth surface of the substrate 28 is positioned upstream from the second openings 33 by about 3 mm. The gaseous $PH_3$ and $H_2$ emitted from the first openings 34 are sucked through the second openings 33 and drawn off simultaneously with the movement of the holder 27. Thus, an n-InP epitaxial layer is grown on the substrate 28 without danger of the $PH_3$ and $H_2$ as the separator gas affecting the growth.

After an n-InP epitaxial layer having a desired thickness is obtained, the holder 27 is moved downward to be set at the lower position, in which the level of the substrate surface is equal to that of the first openings 34, and at the same time, the suction of the $PH_3$ and $H_2$ is stopped. Then, the $PH_3$ and $H_2$ are emitted from the first openings 34 again to the substrate 28. As a result, the substrate 28 is covered with the $PH_3$ and $H_2$ and separated from the TMIn, so that the transition region of crystal composition is difficult to be formed.

Next, the supply rate of the TMIn through the tube 23b is reduced to 70 ml/min and supply of triethylgallium (TEG) $(C_2H_5)_3Ga$ to the reactor 22 through the tube 23b is commenced at a rate of 50 ml/min. In addition, the supply of the $PH_3$ through the tube 23b is stopped and instead, a supply of $AsH_3$ is commenced through the tube 23 at a rate of 100 ml/min.

When the supplies of TMIn, TEG and $AsH_3$ become stationary about two minutes later, the holder 27 is moved upward and set at the upper position. And at the same time as the movement, in the vicinity of the substrate 28 are sucked through the second openings 33 and drawn off from the reactor 22. Thus, since the $PH_3$ as the group V component material does not remain in the vicinity of the substrate 28, an i-InGaAs epitaxial layer is grown on the n-InP epitaxial layer with the transition regions of crystal composition and carrier concentration being reduced.

If the above-described processes are repeated, heteroepitaxial layers having such narrower transition regions as above and a desired structure of III-V compound semiconductors can be obtained.

Heteroepitaxial layers having the same structure as in FIG. 2 were grown by the above-described processes. In the layers, it was found that widths of transition regions of crystal composition at the boundaries are approximately 4 nm, which is nearly equal to ($\frac{1}{2}$) of the conventional one, by the TEM, and that widths of transition regions of carrier concentration at the boundaries are approximately 8 nm, which is nearly equal to ($\frac{1}{4}$) of the conventional one, by the SIMS.

Third Embodiment

Figure 5:
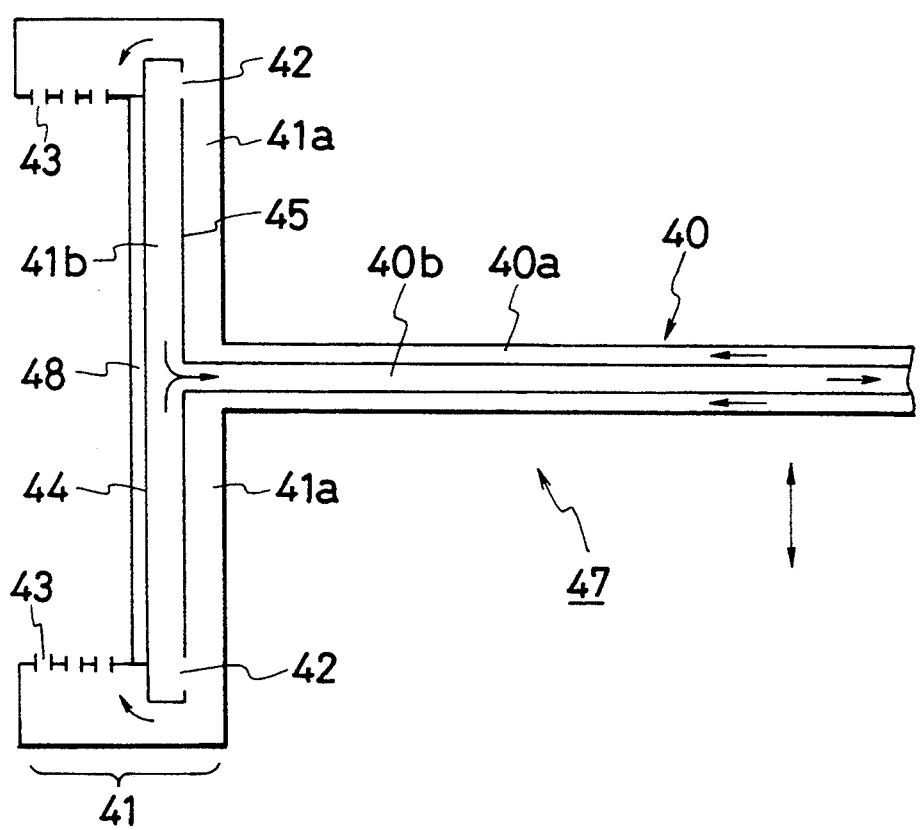
FIG. 5 is a cross-sectional view schematically showing a substrate holder used for a vapor phase epitaxial growth system of a III-V compound semiconductor according to a third embodiment of the present invention.

FIG. 5 shows a substrate holder used for a vapor phase epitaxial growth system of a III-V compound semiconductor according to a third embodiment.

In FIG. 5, a substrate holder 47 includes the first and second openings and the first and second paths as shown in the embodiments. The system of the third embodiment has the same structure as that of the first embodiment other than that the holder 47 is provided in the reactor 2 instead of the holder 7 and the pipe member 11.

The holder 47 is composed of a support shaft 40 and a cup-like body 41 fixed at the end of the shaft 40. In the shaft 40a, a first tube 40a for supplying introducing a separator gas and a second tube 40b for sucking the separator gas are arranged, and the tube 40a is coaxially arranged around the tube 40b.

The body 41 is composed of a cylindrical side wall and a circular bottom wall connected therewith, and a semiconductor substrate 48 is held on the outer surface 44 of the bottom wall, as shown in FIG. 5.

In the bottom wall, there are formed a first chamber 41a communicated with the first tube 40a and a second chamber 41b communicated with the second tube 40b. The chambers 41a and 41b are divided by a inner wall 45 and communicated through second openings 42 formed in the inner wall 45. First openings 43 for emitting the separator gas therefrom are formed on the inner surface of the side wall of the body 41.

The separator gas is emitted from the first openings 43 through the first tube 40a and the first chamber 41a to the vicinity of the substrate 48, and the gas in the vicinity is sucked from the openings 43 through the first chamber 41a, the second openings 42, the second chamber 41b and the first tube 40a.

A VPE method using the system of the third embodiment is the same as that in the first embodiment other than that the way of emitting and sucking the separator gas to the substrate 48 is different from that in the first embodiment, and that relative movement between the substrate holder 7 and the cylindrical pipe member 11 is not required.

Heteroepitaxial layers having the same structure as in FIG. 2 ware grown using the system of the third embodiment. In the layers, it was found that widths of transition regions of crystal composition at boundaries between the i-InGaAs layer and the adjacent n-InP layers are approximately 5 nm, which is nearly equal to ($\frac{1}{4}$) of the conventional one, by the TEM, and that widths of transition regions of carrier concentration at the boundaries are approximately 7 nm, which is nearly equal to ($\frac{1}{4}$) of the conventional one, by the SIMS.

Fourth Embodiment

Figure 6:
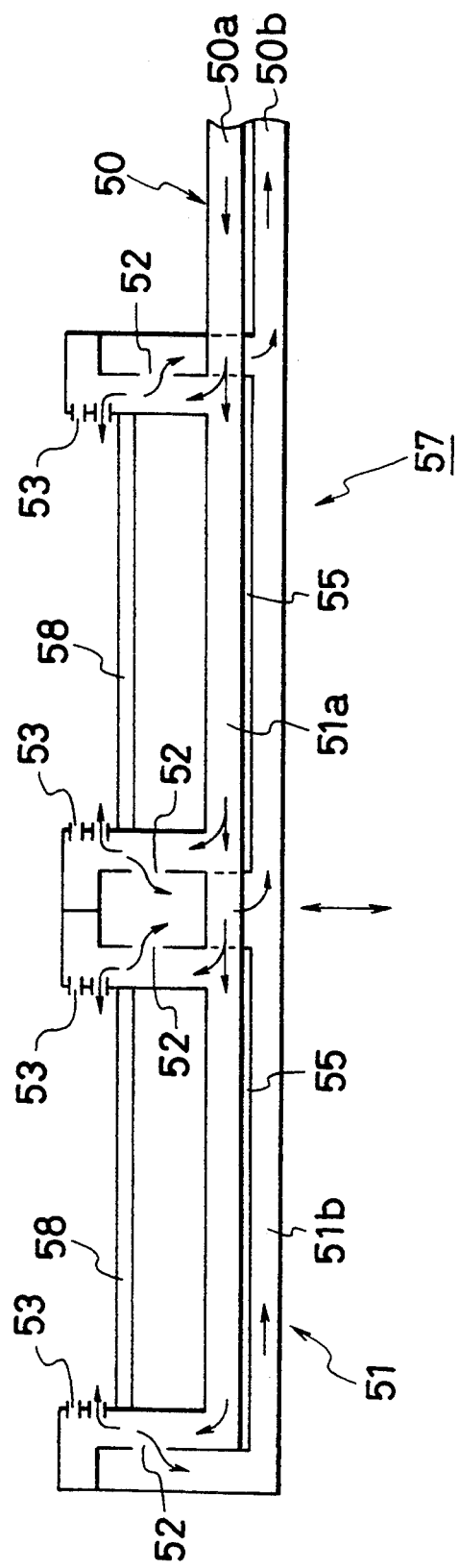
FIG. 6 is a cross-sectional view schematically showing a substrate holder used for a vapor phase epitaxial growth system of a III-V compound semiconductor according to a fourth embodiment of the present invention.

FIG. 6 shows a substrate holder used for a vapor phase epitaxial growth system of a III-V compound semiconductor according to a fourth embodiment, in which two semiconductor substrates can be held by the holder at the same time.

The system of the fourth embodiment has the same structure as that of the first embodiment other than that the holder 57 is provided in the reactor 2 instead of the holder 7 and the pipe member 11.

In FIG. 6, a substrate holder 57 is composed of a support shaft 50 and a cup-like body 51 fixed at the end of the shaft 50. In the shaft 50, a first tube 50a for introducing the separator gas and a second tube 50b for sucking the separator gas are arranged.

The body 51 has two holding parts which are composed of a cylindrical side wall and a circular bottom wall connected therewith, respectively, and respective semiconductor substrates 58 are held on the outer surfaces of the bottom walls. The holder 57 is moved upward or downward vertically with the substrates 58 being held horizontally.

In the bottom and side walls of the parts, there are formed a first chamber 51a in communication with the first tube 50a and a second chamber 51b in communication with the second tube 50b. First openings 53 for emitting the separator gas therefrom are formed on the inner surfaces of the side walls. The chambers 51a and 51b are divided by inner walls 55 and in communication through second openings 42 formed in the sidewalls.

The separator gas supplied through the first tube 50a and the first chamber 51a is emitted from the first openings 53 to the vicinity of the substrates 58, and the gas in the vicinity is sucked from the first openings 53 and drawn off through the first chamber 51a, the second openings 52, the second chamber 51b and the first tube 50a to the outside of the reactor.

A VPE method using the system of the fourth embodiment is the same as that in the first embodiment other than that the way of emitting and sucking the separator gas to the substrates 58 is different from that in the first embodiment, that relative movement between the substrate holder 7 and the cylindrical pipe member 11 is not required, and that the holder 57 is moved vertically with the substrates 58 being held horizontally.

Heteroepitaxial layers having the same structure as in FIG. 2 ware grown using the system of the fourth embodiment. In the layers, it was found that widths of transition regions of crystal composition at the boundaries between the i-InGaAs layer and the adjacent n-InP layers are approximately 6 nm, which is nearly equal to ($\frac{1}{4}$) of the conventional one, by the TEM, and that widths of transition regions of carrier concentration at the boundaries are approximately 10 nm, which is nearly equal to ($\frac{1}{3}$) of the conventional one, by the SIMS.

In the above embodiments, heteroepitaxial layers of III-V compound semiconductors are formed; however, heteroepitaxial layers of any compound semiconductors other than the III-V one may be formed using the method and the systems of the present invention.

Besides, any vapor phase epitaxial growth method using a material other than hydride and metal organic compounds may be realized.

It is to be understood that the present invention is not limited to the embodiments except as defined in the appended claims.

What is claimed is:

1. A vapor phase epitaxial growth method of a compound semiconductor comprising:

a first step of epitaxially growing a first compound semiconductor layer on a semiconductor substrate which is held by a substrate holder in a reactor using a first growth gas which flows in a first direction;

a second step of moving said substrate along with a discharging opening for emitting a separator gas so that said discharging opening is positioned in a vicinity of said substrate, said emitted separator gas flowing along said first direction along with said first growth gas;

a third step of supplying said separator gas through said discharging opening to said vicinity of said substrate thereby to separate said substrate from said first growth gas;

a fourth step of moving said substrate and said discharging opening along said first direction of said first growth gas so that a sucking opening for said separator gas is positioned at a downstream side of said substrate and said supplied separator gas is sucked through said sucking opening; and a fifth step of epitaxially growing a second compound semiconductor layer on said first compound semiconductor layer by supplying a second growth gas along said first direction of said first growth gas in said reactor to said vicinity of said substrate in order to epitaxially grow a second compound semiconductor layer on said first compound semiconductor layer.

2. The method as claimed in claim 1, wherein a gaseous group III component material and a gaseous group V component material are used as said first and second growth gasses thereby to epitaxially grow III-V compound semiconductor layers, and a gas containing a group V component material is used as said separator gas.

3. The method as claimed in claim 1, wherein there is a pipe member having said discharging opening and said sucking opening;

said substrate holder is disposed in said pipe member;

said pipe member and said substrate holder can be moved relatively; and said second and fourth steps are carried out by relatively moving at least one of said pipe member and said substrate holder.

4. The method as claimed in claim 3, wherein said discharging opening and said sucking opening are formed at an end of said pipe member;

said substrate being behind said end of said pipe member when said separator gas is emitted from said discharging opening; and said substrate being in front of said end of said pipe member when said separator gas is sucked.

5. A vapor phase method of growing an epitaxial layer on a semiconductor substrate, said method comprising the step of:

providing a reactor in a crystal growing furnace having upstream and downstream ends;

passing a stream of carrier gas in said upstream end through said reactor and out said downstream end;

supporting a component material in an upstream section of said reactor for said carrier gas stream to carry said component material down stream;

mounting a semiconductor substrate in said reactor downstream of said component material whereby said semiconductor substrate is bathed by said component material carried by said carrier gas stream;

two conduits extending to and ending in a vicinity of said semiconductor, one of said conduits expelling a separator gas into said carrier gas stream and the other of said conduits sucking gas from a point upstream of a location where said separator gas is expelled into said carrier gas stream; and moving said semiconductor between two points upstream and downstream of said location where said separator gas is expelled into and sucked from said carrier gas stream.

6. The method of claim 5 wherein said two points are horizontally disposed within said reactor, and the step of moving said semiconductor substrate horizontally between said two points.

7. The method of claim 5 wherein said two points are vertically disposed within said reactor, and the step of moving said semiconductor substrate vertically between said two points.

8. The method of claim 5 wherein said two conduits are coaxially disposed and the step of mounting said semiconductor substrate within a cup shaped device into which said separator gas is expelled and from which said gas is sucked.

9. The method of claim 5 wherein there are two holders for semiconductor substrates and the added step of mounting two semiconductor substrates in said two holders, and separately feeding said separator gas into and sucking said gas from said two holders.

* * * * *